United States Patent
Lin et al.

(10) Patent No.: US 6,864,513 B2
(45) Date of Patent: Mar. 8, 2005

(54) LIGHT EMITTING DIODE BULB HAVING HIGH HEAT DISSIPATING EFFICIENCY

(75) Inventors: Ting-Hao Lin, Taipei (TW); Li-Wei Kuo, Taipei (TW)

(73) Assignee: Kaylu Industrial Corporation, Taoyuan (TW)

( * ) Notice: Subject to any disclaimer, the term of this patent is extended or adjusted under 35 U.S.C. 154(b) by 0 days.

(21) Appl. No.: 10/431,013

(22) Filed: May 7, 2003

(65) Prior Publication Data

US 2004/0222516 A1 Nov. 11, 2004

(51) Int. Cl.[7] .................................................. H01L 29/22
(52) U.S. Cl. ............................. 257/99; 257/81; 257/84; 257/712
(58) Field of Search .......................... 257/257, 81–93, 257/712, 723, 290–293, 675

(56) References Cited

U.S. PATENT DOCUMENTS

| | | | |
|---|---|---|---|
| 5,857,767 A | * | 1/1999 | Hochstein .................... 362/294 |
| 6,548,832 B1 | * | 4/2003 | Sakamoto et al. ............. 257/88 |
| 2002/0063328 A1 | * | 5/2002 | Baek et al. .................. 257/706 |
| 2002/0085379 A1 | * | 7/2002 | Han et al. .................... 362/227 |
| 2003/0008431 A1 | * | 1/2003 | Matsubara et al. ........... 438/98 |

* cited by examiner

Primary Examiner—Nathan J. Flynn
Assistant Examiner—Leonardo Andújar
(74) Attorney, Agent, or Firm—Jackson Walker LLP

(57) ABSTRACT

A light emitting diode (LED) bulb includes a heat sink, a circuit layer having two opposite sides, multiple LEDs mounted on one side and an electrical insulating layer connected between the opposite side and the heat sink. Heat generated by the LEDs is conducted to the heat sink through the circuit layer and the electrical insulting layer and is dissipated quickly. Further, a fan can be mounted on the fins to dissipate heat from the heat sink more quickly. Therefore, the LED bulb has good heat dissipating efficiency.

8 Claims, 4 Drawing Sheets

LIGHT EMITTING DIODE BULB HAVING HIGH HEAT DISSIPATING EFFICIENCY

BACKGROUND OF THE INVENTION

1. Field of the Invention

The present invention relates to a light emitting diode (LED) bulb, and more specifically to a light emitting diode bulb having high heat dissipating efficiency.

2. Description of Related Art

Light emitting diode (LED) modules composed of many LEDs are used in many applications such as flat screen displays and devices to provide illumination. LED are small, inexpensive, low power, etc., so more and more LED modules with different capabilities are being developed.

LED modules for use in a display or an illumination device require many LEDs, and most of the LEDs are driven at the same time, which results in a quick rise in temperature of the LED module. Since general LED modules do not have heat sinks with good heat dissipating efficiencies, operation of general LED modules is often erratic and unstable because of the rapid build up of heat. Consequently, the light from the LED module often flickers that causes degradation of the quality of the display or illumination.

The present invention provides an LED module to mitigate or obviate the aforementioned problems.

SUMMARY OF THE INVENTION

An objective of the present invention is to provide a light emitting diode (LED) module that can easily and quickly dissipate heat to keep operation of the LEDs from being erratic or unstable.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
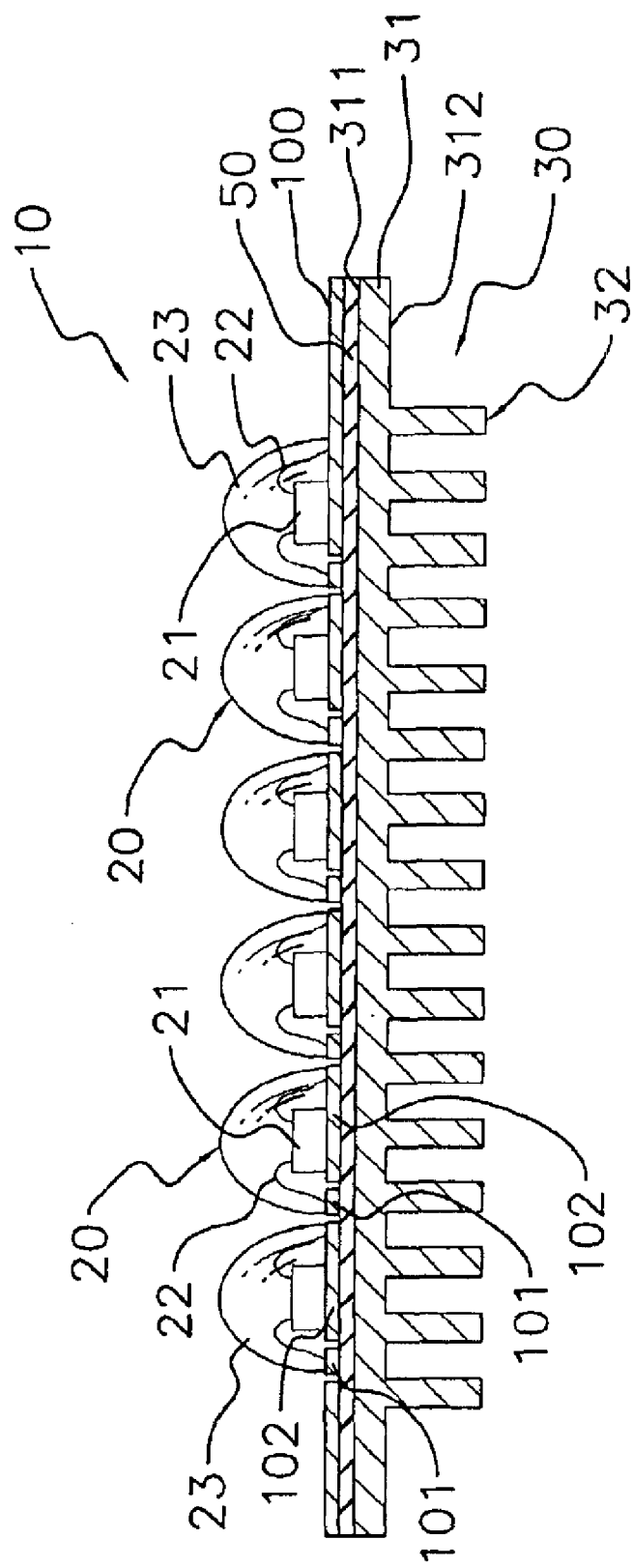
FIG. 1 is a side plan view in partial section of a first embodiment of an LED module in accordance with the present invention.

With reference to FIG. 1, a first embodiment of an LED module (10) in accordance with the present invention comprises a heat sink (30), an electrical insulating layer (50), a circuit layer (100) and multiple LEDs (20). The heat sink (30) has a base (31) and fins (32). The base (31) has a top (311) and a bottom (312). The fins (32) are integrally formed on and extend from the bottom (312). The electrical insulating layer (50) is formed on the top (311). The electrical insulating layer can be an oxidation layer or a heat dissipating glue.

The circuit layer (100) has a front side (not numbered), a rear side (not numbered), multiple pad sets (not numbered) and associated circuitry (not shown) to electrically connect the pad sets. The rear side is mounted on the electrical insulating layer on the heat sink. Each pad set has a die pad (102) and at least one bonding pad (101). The circuit layer (100) is made of a metal with high electrical conductivity. The metal can be copper.

The LEDs (20) are mounted on the front side of the circuit layer (100). Each LED (20) has a chip (21), wires (22) and encapsulant (23). The chip (21) is mounted on the die pad (102). The wires (22) are bonded between the bonding pads (101) and the chip (21). The encapsulant (23) covers the chip (21) and the wires (22).

Based on the forgoing description, the circuit layer (100) is connected to an external driver (not shown) to control operation of the LEDs (20). When the LEDs (20) are driven to light, heat of the LEDs (20) builds up rapidly. The heat is immediately conducted to the heat sink (30) through the circuit layer (100) and the electrical insulating layer (10), and the heat is dissipated by the heat sink (30) to ensure normal operation of the LED module (10).

Figure 2:
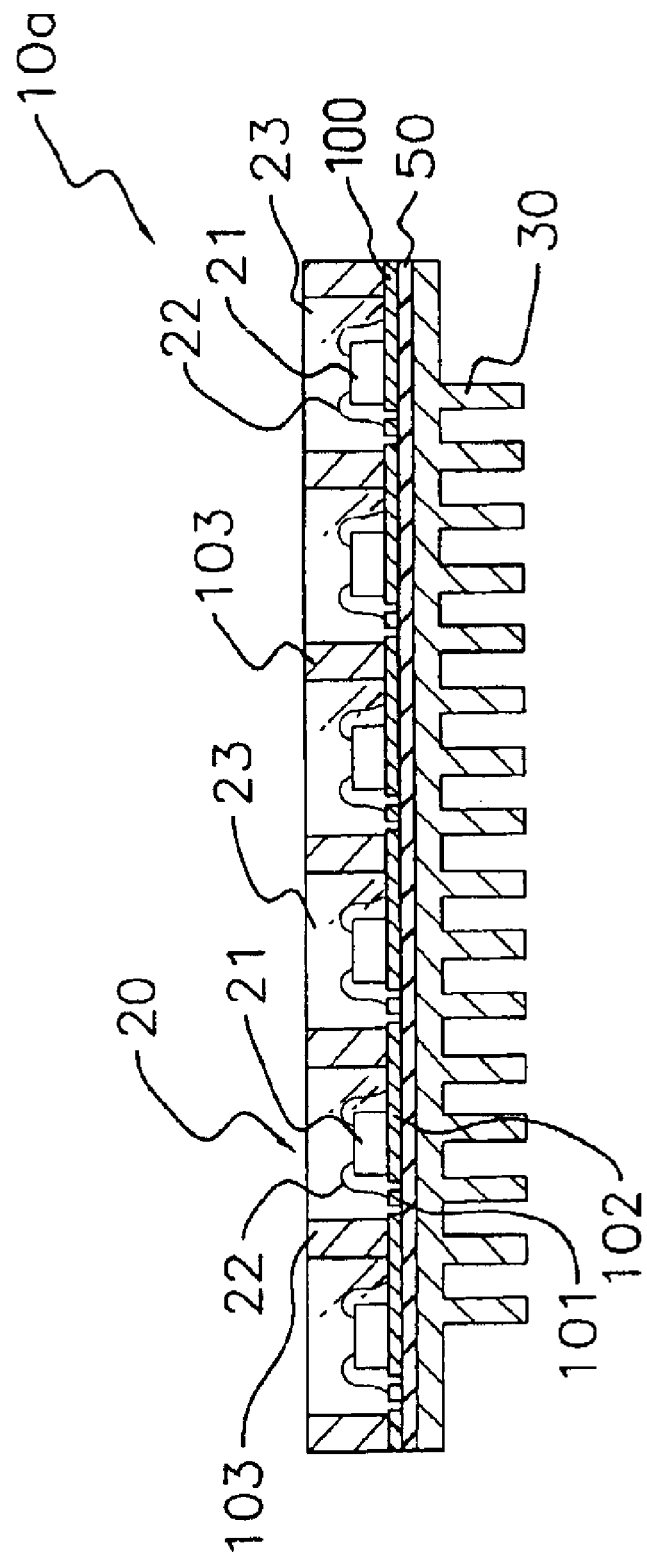
FIG. 2 a side plan view in partial section of a second embodiment of an LED module in accordance with the present invention.

With reference to FIG. 2, a second embodiment of an LED module (10a) in accordance with the present invention is similar to the first embodiment except that the second embodiment of the LED module (10a) further comprises multiple frames (103). The frames (103) are mounted on the front side of the circuit layer (100) and separate adjacent pad sets. Therefore, individual LEDs (20) are bounded by the frames (103), and the frames (103) form a matrix (not shown) on the circuit layer (100) where each LED (20) is one pixel of a display (not shown). The chip (21) can be either a single color type or multi-color type.

Figure 3:
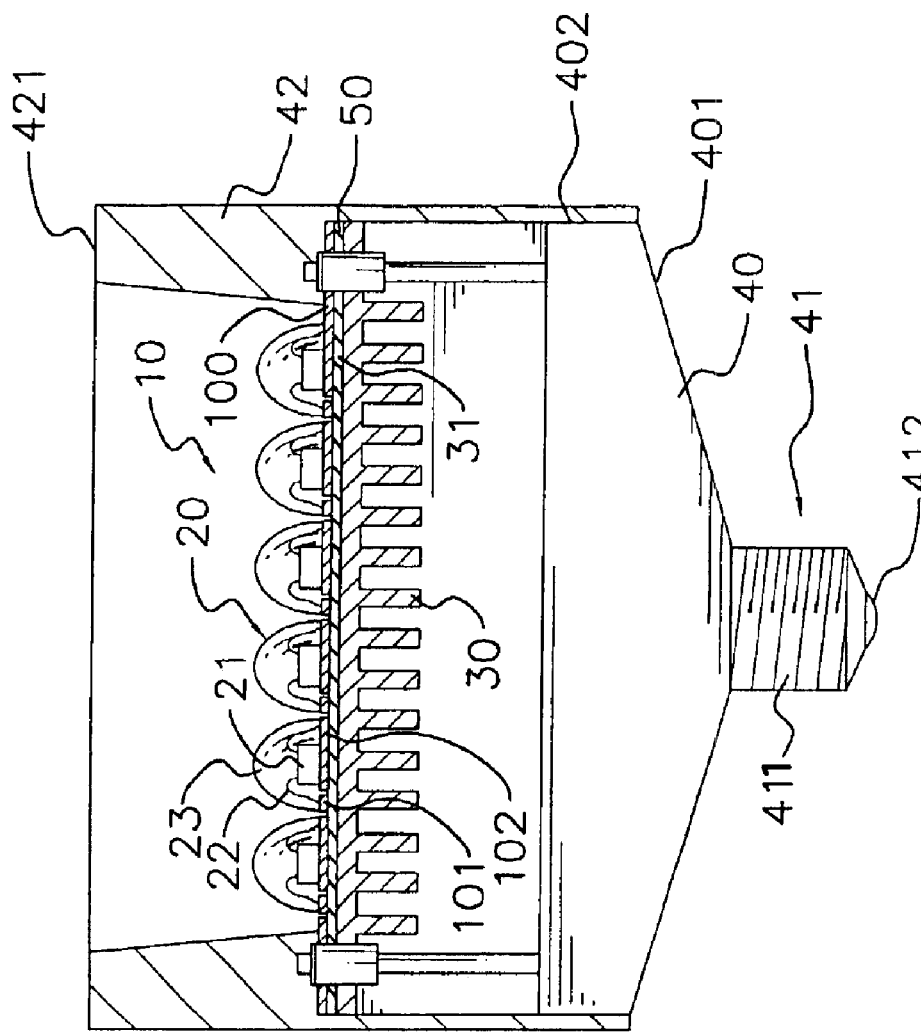
FIG. 3 is a side plan views in partial section of the LED module in FIG. 1 used in a lamp.

With further reference to FIG. 3, either of the LED modules (10, 10a) previously described can be used as a source of illumination in a light bulb (not numbered). To simplify the description, only the first embodiment of the LED module (10) is used in the description, but the second embodiment of the LED module (10a) is fully applicable to the application described.

The bulb comprises an LED module (10), a seat (40), a threaded plug (41) and an external protector (42). The seat (40) has a driving circuit (not shown), a bottom (401) and sides (402). The LED module (10) is mounted on the seat (40) between the sides (402). The driving circuit is connected to the circuit layer (100) of the LED module (10) to drive the LEDs (20). The threaded plug (41) is connected to the bottom (401) of the seat (40) to connect the bulb to a bulb socket (not shown) selectively connected to a source of electricity (not shown). The threaded plug (41) has an outer threaded contract (411) and a tip contact (412) so the electricity selectively connected to a bulb socket is supplied to the driving circuit in the seat (40) and the LED module (10) when the threaded plug (41) is connected to the bulb socket. The heat from the LEDs (20) is immediately conducted to the circuit layer (100), the electrical insulating layer (50) and the heat sink (30) and is dissipated.

The external protector (42) has sides (not numbered) and a top edge (421). The sides of the external protector are mounted around the sides (402) of the seat (40). The top edge (421) of the external protector (42) is higher than the LED module (10) on the seat (40). The external protector (42) may be transparent, translucent or reflective. When the external protector (42) is transparent or translucent, the lamp can be used in as a decorative or warning device. When the external protector (42) is reflective, the lamp can focus or disperse light generated by the LED module (10) to make the lamp respectively a spotlight or a floodlight.

Figure 4:
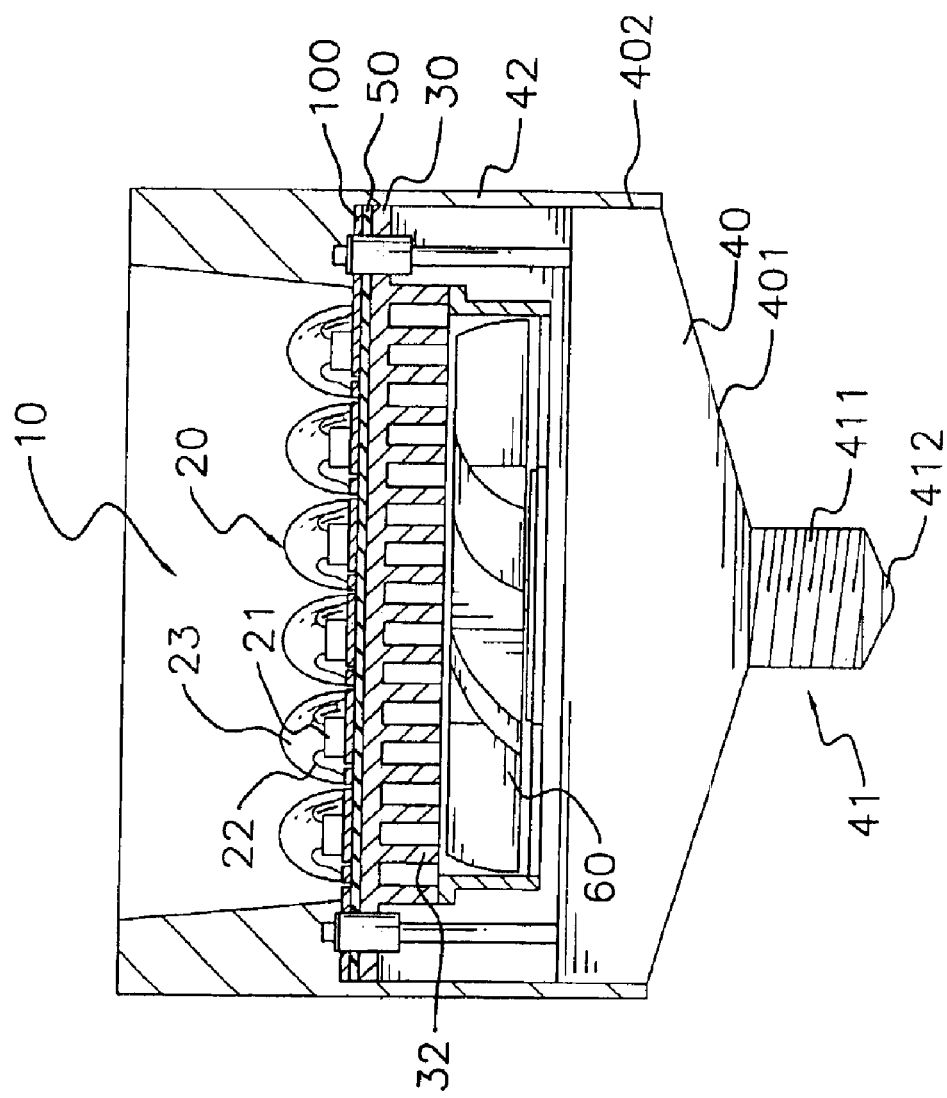
FIG. 4 is a side plan view in partial section of an LED module in FIG. 1 with a fan used in a lamp.

With reference to FIG. 4, the LED module (10) may further comprise a fan (60) to dissipate heat on the heat sink (30) more quickly. The fan (60) is mounted on the fins (32) and is driven by the driving circuit in the seat (40). When the driving circuit lights the LED module (10), the fan (60) moves heated air on the heat sink (30) away from the heat sink (30).

The LED module as described dissipates heat efficiently through the heat sink, even when all the LEDs on an LED module are lighted. Furthermore, a fan on the fins of the heat sink causes the heat sink to dissipate even more heat.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light emitting diode (LED) bulb comprising:
   a seat having a driving circuit, a bottom and sides;
   a threaded plug connected to the bottom of the seat and adapted to connect to a bulb socket;
   an external protector having sides and a top edge, wherein the sides of the external protector are mounted around the sides of the seat; and
   an LED module mounted on the seat and connected to the driving circuit wherein the LED module comprises:
      a heat sink having multiple fins and a base with a top and a bottom;
      an electrical insulting layer formed on the top of the heat sink;
      a circuit layer made of a highly electrical conductive material and formed on the electrical insulating layer, wherein the circuit layer has a front side and a rear side and is composed of multiple pad sets and the driving circuit is electrically connected to the pad sets, wherein each pad set has a die pad and at least one bonding pad corresponding to the die pad; and
      multiple LEDs mounted on the front side of the circuit layer, wherein each of the multiple LEDs has a chip connected to one of the die pads, at least one wire bonded between the chip and the at least one bonding pad corresponding to the die pad on which the chip is mounted and an encapsulant covering the chip and the at least one wire bonded between the chip and the bonding pad corresponding to the die pad;
      whereby heat from the LEDs is immediately conducted to the heat sink through the circuit layer and electrical insulting layer to dissipate from the LED module.

2. The LED bulb as claimed in claim 1, wherein the electrical insulting layer is an oxidation layer.

3. The LED bulb as claimed in claim 1, wherein the electrical insulting layer is a heat dissipating glue.

4. The LED bulb as claimed in claim 1, wherein each chip is a single color type.

5. The LED bulb as claimed in claim 1, wherein each chip is a multi-color type.

6. The LED bulb as claimed in claim 1 further comprising a fan mounted on the fins of the heat sink.

7. The LED bulb as claimed in claim 1, wherein the top edge of the external protector is higher than the LED module on the seat.

8. The LED bulb as claimed in claim 7 further comprising a fan mounted on the fins of the heat sink and held in the external protector.

* * * * *